United States Patent
Cischke et al.

(10) Patent No.: US 9,824,178 B2
(45) Date of Patent: Nov. 21, 2017

(54) ACTIVE BOLSTER VENT DISTRIBUTION FOR STRESS AND LOAD MANAGEMENT

(71) Applicant: FORD GLOBAL TECHNOLOGIES, LLC, Dearborn, MI (US)

(72) Inventors: Kaitlin M. Cischke, Bloomfield Hills, MI (US); Stacey H. Raines, Ypsilanti, MI (US); Nicholas A. Mazzocchi, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 30 days.

(21) Appl. No.: 15/163,979

(22) Filed: May 25, 2016

(65) Prior Publication Data

US 2016/0275235 A1 Sep. 22, 2016

Related U.S. Application Data

(62) Division of application No. 14/659,724, filed on Mar. 17, 2015, now Pat. No. 9,376,085.

(51) Int. Cl.

| | |
|---|---|
| *B60R 21/239* | (2006.01) |
| *B60R 21/206* | (2011.01) |
| *G06F 17/50* | (2006.01) |
| *B60R 21/04* | (2006.01) |
| *B60R 21/00* | (2006.01) |
| *B60R 13/02* | (2006.01) |
| *B60R 21/13* | (2006.01) |
| *B60R 21/235* | (2006.01) |
| *B60R 21/231* | (2011.01) |

(52) U.S. Cl.
CPC .......... *G06F 17/5095* (2013.01); *B60R 21/04* (2013.01); *B60R 21/206* (2013.01); *B60R 13/02* (2013.01); *B60R 21/131* (2013.01); *B60R 21/235* (2013.01); *B60R 21/239* (2013.01); *B60R 2021/0051* (2013.01); *B60R 2021/0407* (2013.01); *B60R 2021/2359* (2013.01); *B60R 2021/2395* (2013.01); *B60R 2021/23169* (2013.01); *Y02T 10/82* (2013.01)

(58) Field of Classification Search
CPC ... B60R 21/239; B60R 21/206; B60R 21/045; B60R 21/04; B60R 2021/23169; B60R 2021/0051
USPC .................. 280/730.1, 728.1, 740, 752, 732
See application file for complete search history.

(56) References Cited

U.S. PATENT DOCUMENTS 8,454,054 B1 6/2013 Raines
8,720,943 B1 5/2014 Mazzocchi et al.
(Continued)

*Primary Examiner* — Keith J Frisby
(74) *Attorney, Agent, or Firm* — Vichit Chea; MacMillan, Sobanski & Todd, LLC

(57) ABSTRACT

An active bolster mounts at an interior trim surface of a passenger compartment in an automotive vehicle. A plastic-molded front wall deploys in a deployment direction toward a passenger in the passenger compartment. A plastic-molded bladder member is joined along an outer perimeter with the front wall by a hot weld seam to form an inflatable bladder. The bladder member includes at least one substantially circumferential pleated baffle. An inflator couples an inflation gas into the inflatable bladder in response to a crash event of the vehicle. The pleated baffle forms a plurality of at least five vent openings including at least one stress relief vent juxtaposed to a peak stress region of the hot weld seam and a plurality of tuning vents which are concentrated at a lowest restraint-force region of the inflatable bladder.

3 Claims, 6 Drawing Sheets

(56) References Cited

U.S. PATENT DOCUMENTS 8,850,681 B2 10/2014 Hardigg et al.
8,931,803 B2 1/2015 Roychoudhury
8,936,273 B1 1/2015 Raines et al.

ACTIVE BOLSTER VENT DISTRIBUTION FOR STRESS AND LOAD MANAGEMENT

CROSS REFERENCE TO RELATED APPLICATIONS

This is a divisional application based on co-pending U.S. application Ser. No. 14/659,724, filed Mar. 17, 2015, which is incorporated by reference in its entirety.

STATEMENT REGARDING FEDERALLY SPONSORED RESEARCH

Not Applicable.

BACKGROUND OF THE INVENTION

The present invention relates in general to active bolsters for occupant crash protection in automotive vehicles, and, more specifically, to an active bolster with an inflatable bladder formed by plastic wall panels that is vented for a controlled release of inflation gas to reduce peak stresses on a weld seam between the panels and to tune restraint forces provided at different locations of the bolster.

An active bolster is a vehicle occupant protection device with a gas-inflatable bladder to absorb impacts and reduce trauma to occupants during a crash. As opposed to deployable air bag cushions made of various fabrics that emerge from behind various openings upon inflation, active bolsters use the interior trim surface itself to expand at the beginning of a crash event for absorbing the impact and dissipating energy through the action of an inflation gas. U.S. Pat. No. 8,205,909, issued Jun. 26, 2012, incorporated herein by reference, discloses an active knee bolster integrated into a glove box door that is light weight and visually attractive. U.S. Pat. No. 8,474,868, issued Jul. 2, 2013, also incorporated herein by reference, discloses a typical structure wherein an active bolster includes a front wall or trim panel that faces a vehicle occupant attached to a back wall or bladder member along a sealed periphery. One or both of the walls is deformable in order to provide an expandable, inflatable bladder. For example, the bladder member may have a pleated (i.e., accordion-like) region that straightens out during inflation. The walls are initially spaced apart by a small amount when in their pre-deployment, non-inflated condition. This allows ingress of the inflation gas in a manner that achieves an even inflation across the panel.

The front and back walls of a typical bladder for an active bolster are comprised of molded thermoplastics such as polyethylene, polyolefin, or PVC. They are typically injection molded but can also be blow molded. When formed separately, the front and back walls must be hermetically joined around their periphery in order to form the inflatable bladder. The joint must be strong to resist separation that could result from high inflation pressures during inflation and that result when a passenger impacts the bolster. The peripheral seal is formed by hot welding, for example.

It is known that in order to optimize the dissipation of energy when an occupant contacts an air bag or an active bolster, inflation gas should be vented to allow a controlled collapse of the airbag that safely decelerates the impacting occupant. U.S. Pat. No. 8,720,943, issued May 13, 2014, which is incorporated herein by reference, discloses an active vent structure for providing a variable vent flow rate. A vent window formed within the pleated baffle region includes a flap that deflects in response to gas pressure to provide a variable window opening.

Various types of structures and locations have been disclosed for venting inflation gas during inflation and during loading by an impacting passenger. Venting locations have been disclosed on the central, flat areas of the bladder wall facing the front wall, in the pleated baffle region of the bladder wall, and in welding towers that attach the bladder wall to a reaction surface, for example. It has been suggested that an active vent can be placed in close proximity to local regions where the stresses of inflation forces may create a highest probability of weld failure. However, the placement and relative capacities of vents can provide additional improvements in stress management and tuning of restraint forces than has been realized in the art.

SUMMARY OF THE INVENTION

In one aspect of the invention, an active bolster mounts at an interior trim surface of a passenger compartment in an automotive vehicle. A plastic-molded front wall deploys in a deployment direction toward a passenger in the passenger compartment. A plastic-molded bladder member is joined along an outer perimeter with the front wall by a hot weld seam to form an inflatable bladder. The bladder member includes at least one substantially circumferential pleated baffle. An inflator couples an inflation gas into the inflatable bladder in response to a crash event of the vehicle. The pleated baffle forms a plurality of at least five vent openings including at least one stress relief vent juxtaposed to a peak stress region of the hot weld seam and a plurality of tuning vents which are concentrated at a lowest restraint-force region of the inflatable bladder.

DETAILED DESCRIPTION OF PREFERRED EMBODIMENTS

Figure 1:
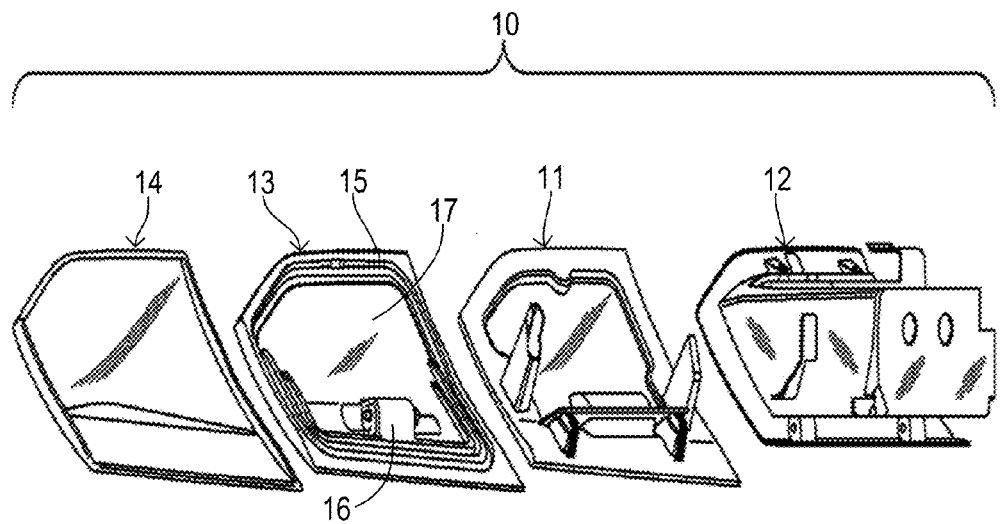
FIG. 1 is an outward-looking, exploded perspective view of an active knee bolster glove box door system of a type to which the present invention can be applied.

Referring now to FIG. 1, a prior art active knee bolster system 10 has a base panel component 11 which forms the foundation for the bolster. Base 11 may be either attached to the vehicle by hinging from a storage cavity or glove box 12 as shown in FIG. 1, or mounted to another structure such as an instrument panel support located below a steering column, for example. Such locations are accessible to the knees of an individual passenger riding in a corresponding seating position within a vehicle.

In this embodiment, base 11 is a door inner wall or liner that acts as a reaction surface for supporting an inflatable bladder formed by a back (bladder) wall 13 and a front (trim) wall 14 that are joined around their periphery 15. Walls 13 and 14 are preferably comprised of molded plastics (such as thermoplastic polyolefin (TPO)) and are joined by plastic hot welding, such as hot plate or vibration welding, to form a peripheral seal around a central region 17 for forming an inflatable bladder. An inflation gas source 16 is electronically controlled for activating during a crash to release gas to inflate the bolster. Front wall 14 may comprise the Class A interior trim surface such as the outside of the glove box door, or an additional skin or cover (not shown) can be applied to its outer surface.

Figure 2:
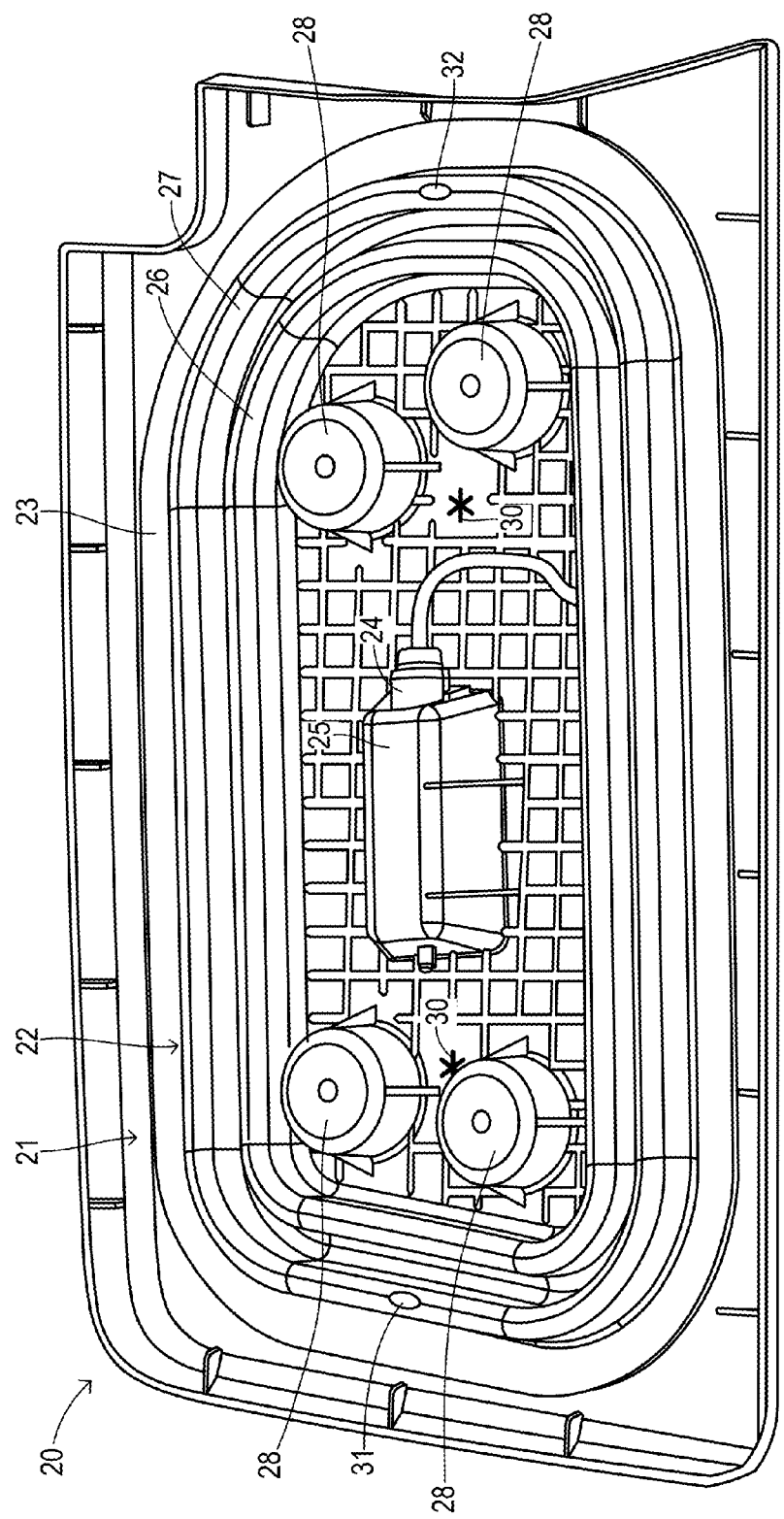
FIG. 2 is a rear perspective view of an inflatable bladder assembly of an active bolster.

FIG. 2 is a rear view of an inflatable bladder 20 for an active bolster. A plastic-molded front wall 21 overlies a plastic-molded, expandable back wall or bladder member 22. Wall 21 and bladder member 22 are joined around a closed perimeter region 23 to form an inflatable bladder having an open central volume between wall 21 and bladder member 22 to receive an inflation gas from an inflator 24 mounted in a recess 25 of bladder member 22 during a crash event. Bladder member 22 includes a plurality of pleats, such as 26 and 27, to accommodate the expansion of bladder member 22 during inflation. A plurality of attachment towers (i.e., bosses) 28 project from a central region of bladder member 22 disposed within baffle pleats 26 and 27. Towers 28 are used to mount bladder member 22 to a reaction surface (not shown). Vent holes 30 comprised of an asterisk-shaped pattern cut through bladder member 22 to vent the bladder chamber.

Figure 3:
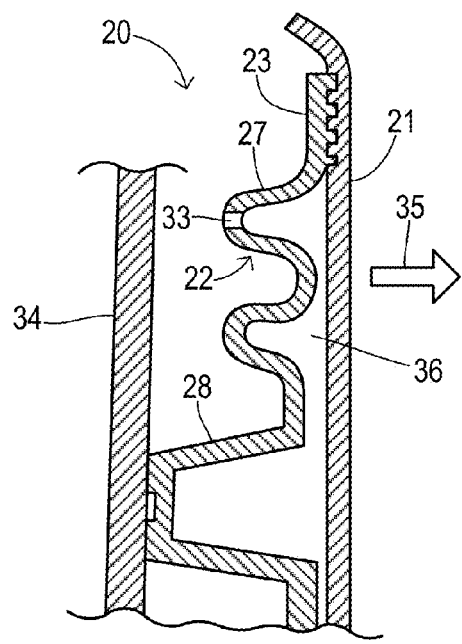
FIG. 3 is a side cross section showing a prior art active bolster assembly.

FIG. 3 shows a cross-section of bladder 20 assembled to a reaction wall 34. Baffle pleat 27 is penetrated by a window opening 33 to provide a vent. During deployment as a result of an inflation gas being supplied into a bladder cavity 36, front trim wall 21 deploys in a deployment direction 35 toward a passenger in the passenger compartment of a vehicle.

Figure 4:
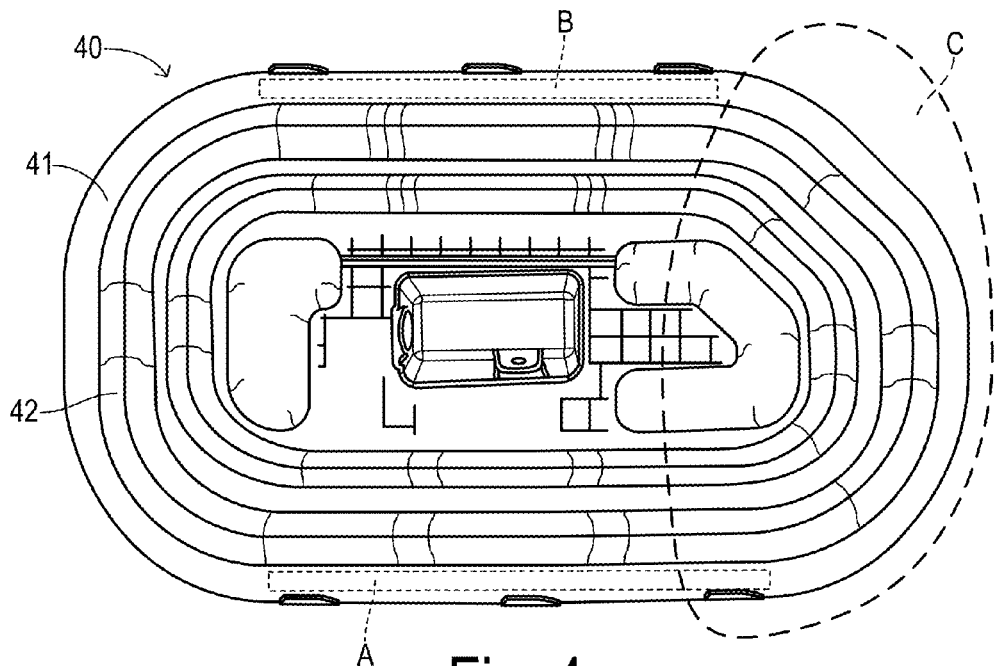
FIG. 4 is a rear, plan view of a bladder member without vent openings.

FIG. 4 shows a bladder member 40 with a peripheral welding flange 41 along a circumferential edge of bladder member 40. A pleated baffle includes a pleat 42 circumferentially disposed within welding flange 41 which unfolds during bolster deployment. In the preferred embodiment, all the vent openings are formed in pleat 42 since close proximity to the hot weld seam provides a better ability to reduce stress on the weld.

The size and peripheral locations of the vent openings are driven by two separate factors, namely i) creation of stress relief at a peak stress region of the hot weld seam and ii) tuning of restraint forces across the bladder to provide the desired restraint interaction with an impacting passenger. In regard to stress relief, peak stress regions of the hot weld seam are determined that would occur in the absence of any significant venting. A typical active bolster has an elongated shape extending horizontally in a vehicle, as shown in FIG. 4. Stress occurring along the weld seam as the bladder inflates and then receives an impact is modeled using computer aided engineering (CAE) tools as part of the conventional design process utilized by engineers. Most typically, the peak stresses occurs along the longest straight sides of a weld seam, such as shown at regions A and B of the weld seam in FIG. 4.

Intended variations of the restraint force created across an active bolster may result from an overall restraint strategy for a particular vehicle in view of many factors such as relative passenger positioning and the influence of other restraint devices. Target values for deflection forces provided at different regions of an active bolster would generally be determined by a design group handling the safety/restraints specifications for a vehicle design. For example, it is often desirable that a left or right side of an active bolster provide greater restraint force than the other. In the case of an active bolster incorporated in a glove box door, a sweeping (i.e., angled) surface of the instrument panel/glove box combination may place one particular side of the active bolster closer to the passenger than the other side. In order to obtain equal loading against the left and right knees of the passenger during an impact, the closest side of the active bolster should provide a lower restraint force to the corresponding knee. In the example of FIG. 4, a region C corresponds to a lowest restraint force region because it interacts with a passenger's left knee. As described below, a concentration of vent openings corresponding to a lowest restraint force region achieves a desired reduction in knee restraint-force loading as a result of a corresponding local increase in venting.

Figure 5:
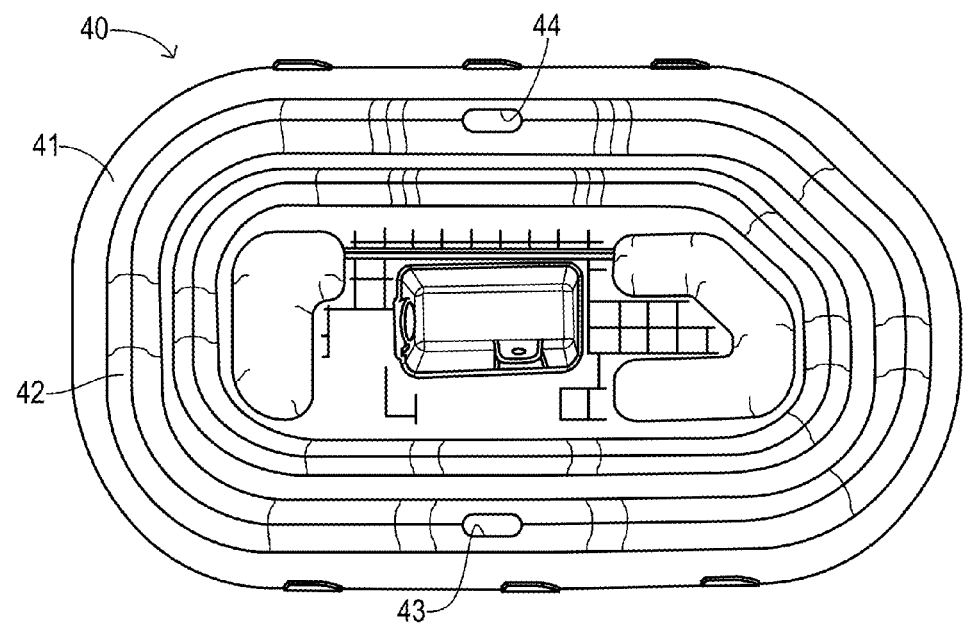
FIG. 5 is a rear, plan view of a bladder member with initial placement of stress relief vents according to one embodiment of the present invention.

As shown in FIG. 5, the invention first places a stress relief vent 43 juxtaposed with peak stress region A of the hot weld seam. In the event that a particular design is found to have additional high stress regions, then more than one relief vent may be used. For example, a second stress relief vent 44 is juxtaposed with peak stress region B. More than two vents can be utilized if additional high stress regions are identified using CAE analysis. Preferably, the stress relief vents have a fixed first aperture area which is relatively large (compared to the tuning vents to be described next) in order to provide sufficient stress relief for the weld seam. In addition, the total area (i.e, cross-sectional flow capacity) provided by the stress relief vents is selected to be somewhat less than the total venting capacity that corresponds to the desired level of impact energy absorption specified for the active bolster. This reserves an additional flow capacity to be provided by the tuning vents. Stress relief vents 43 and 44 may have slotted shapes as shown, or may be circular. The first aperture area may typically correspond to that of a 10 mm diameter hole, for example.

Figure 6:
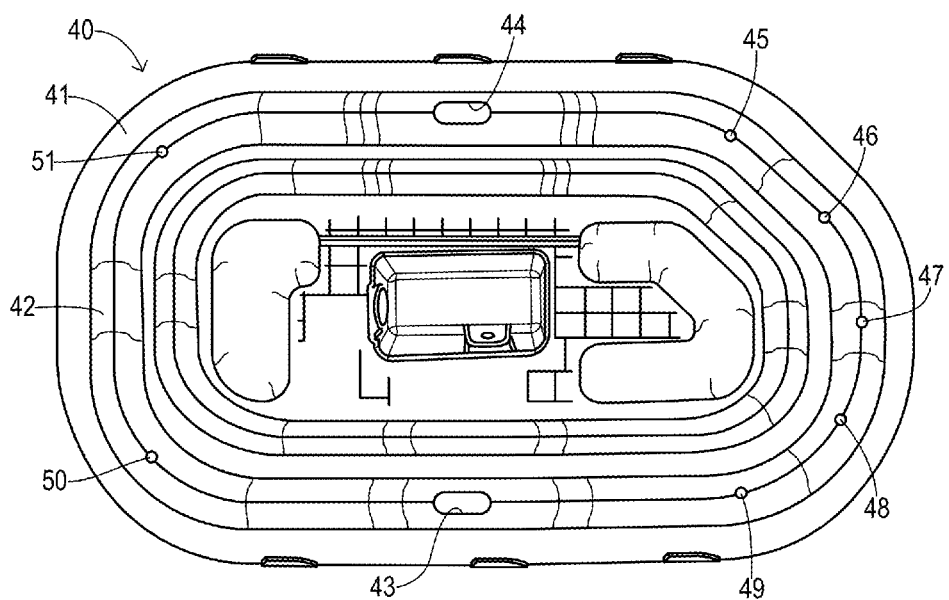
FIG. 6 is a rear, plan view of a bladder member with initial placement of tuning vents according to one embodiment of the present invention.

As shown in FIG. 6, the invention places a plurality of tuning vents along pleat 42 so that the tuning vents are concentrated at lowest restraint-force region C. Thus, tuning vents 45-49 have been placed in pleat 42 along the right side edge of FIG. 6, which corresponds to the left knee of the passenger when bladder member 40 is assembled into a glove box door (not shown). To maintain sufficient impact energy absorption/deflection around the entire hot weld seam, additional tuning vents 50 and 51 are placed along the left side of FIG. 6. Preferably, vent openings (including both stress relief vents and tuning vents) are distributed along the outer perimeter of bladder member 40 such that every possible rotational position of a 90° are along peripheral welding flange 41 includes at least one vent opening. In one preferred embodiment, an initial size for each tuning vent 45-51 has a fixed aperture area that is determined according to the smallest hole that can be reliably formed by the injection molding process that is used to fabricate bladder member 40 (e.g., about 3 mm). Based on the size and number of tuning vents, the total venting capacity based upon the initial configuration of both stress relief and tuning vents shown in FIG. 6 may be less than the total desired venting capacity so that modifications to the relative restraint force provided across bladder member 40 can be adjusted by changing (i.e., increasing) the aperture area of various vent openings as described below.

Figure 7:
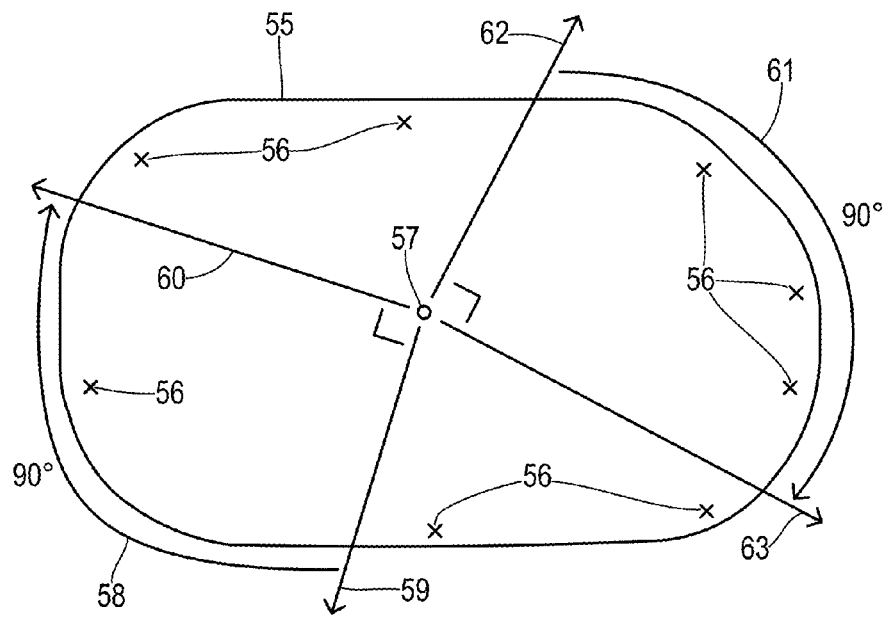
FIG. 7 is a diagram showing arc sections for defining a minimum spacing between vent openings.

In order to avoid stress imbalances and overly large differences of restraint force deflection between different sections of the active bolster, present invention may employ a vent spacing requirement which avoids any long sections of the weld seam without any vent opening. As shown in FIG. 7, the closed-loop path of a hot weld seam 55 extends around a center 57 and along a periphery of a bladder member. A plurality of vent opening locations 56 are distributed around the path. As an arc of a predetermined angular size is rotated around center 57, a vent opening is always present. For example, an arc 58 spanning 90° between a radial line 59 and a radial line 60 includes one vent opening. Rotating the arc to a position 61 between radial lines 62 and 63 results in three included vent openings as a result of a concentration of tuning vents. By ensuring that adjacent vent openings are separated by no more than the predetermined arc size, subsequent adjustment of the restraint forces at any section of the bladder can be fine tuned as described below.

Figure 8:
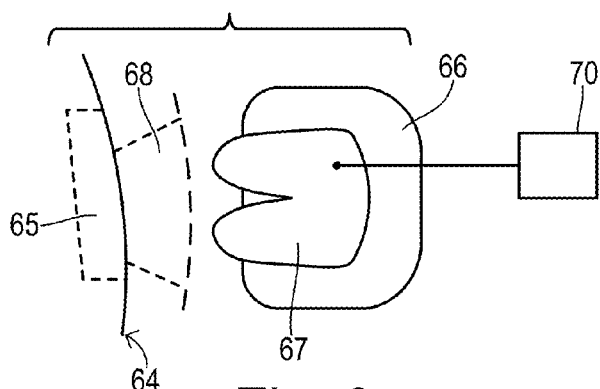
FIG. 8 is a diagram showing developmental testing of an active bolster for fine tuning of the vent openings.

In order to conform the inflation and impact performance of the active bolster to the desired performance determined by the design specifications, physical prototypes using a bladder member having the initial vent opening sizes and locations are crash tested as shown in FIG. 8. Thus, an instrument panel 64 with an active glove box bolster 65 is arranged in a test setup which may include a prototype or simulated passenger compartment with a passenger seat 66. During testing to simulate an impact, the active bolster deploys to a position 68 to receive an impact with a crash dummy 67 which includes sensors connected to a data collection/processor device 70. The sensors measure in actual restraint profile (i.e., restraint force generation during a crash event at different locations on the active bolster) obtained with the initial placement and size of the vent openings. The actual restraint profile may be compared with the desired restraint profile to identify mismatches where the bolster is providing greater than the desired amount of restraint force. In response to any mismatches, selected vent openings nearest the areas of mismatch may have their initial aperture areas increased, thereby reducing the restraint force provided in the corresponding area and reducing the mismatch.

Figure 10:
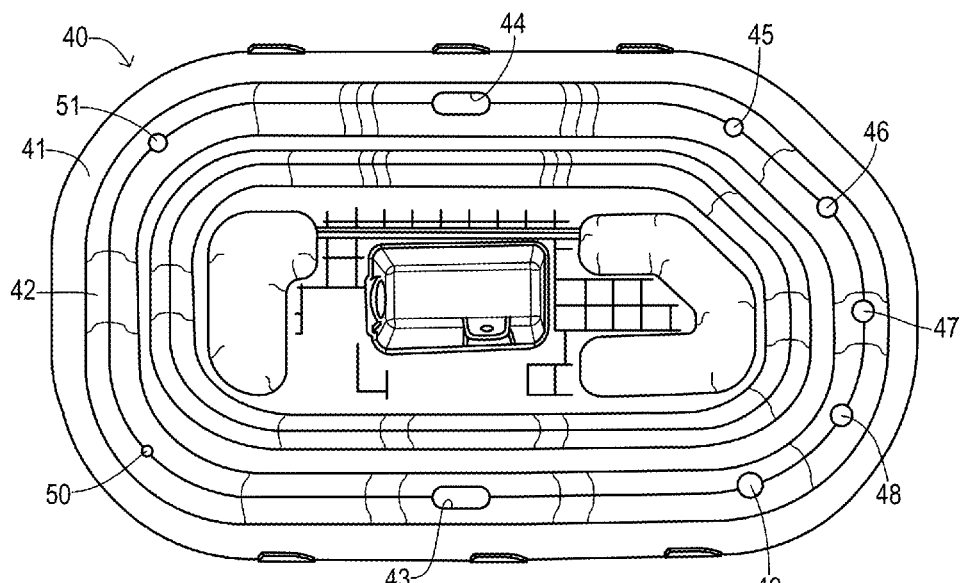
FIG. 10 is rear, plan view of a bladder member with adjusted sizing of the tuning vents after prototype testing.
Figure 9:
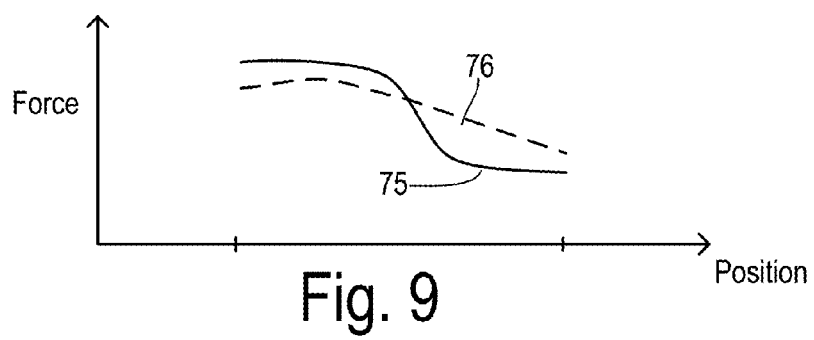
FIG. 9 is a plot showing actual and desired restrain forces from the active bolster.

FIG. 9 depicts a desired restraint profile 75 in which the desired magnitude of the restraint/deflection force varies according to left/right horizontal position across the active bolster. Line 76 represents an actual restraint profile as measured from prototype testing. Positions on the active bolster where line 76 is greater than line 75 are used to identify locations along the weld seam where the included vent openings are increased. Since the aperture sizes are adjusted and no changes in the positions of vent openings is necessary, the prototype tooling developed for the bladder member can be easily adapted and used for final production. Using an iterative process of CAE analysis and prototype testing, final aperture sizes for tuning vents 45-51 are determined as shown in FIG. 10.

Figure 11:
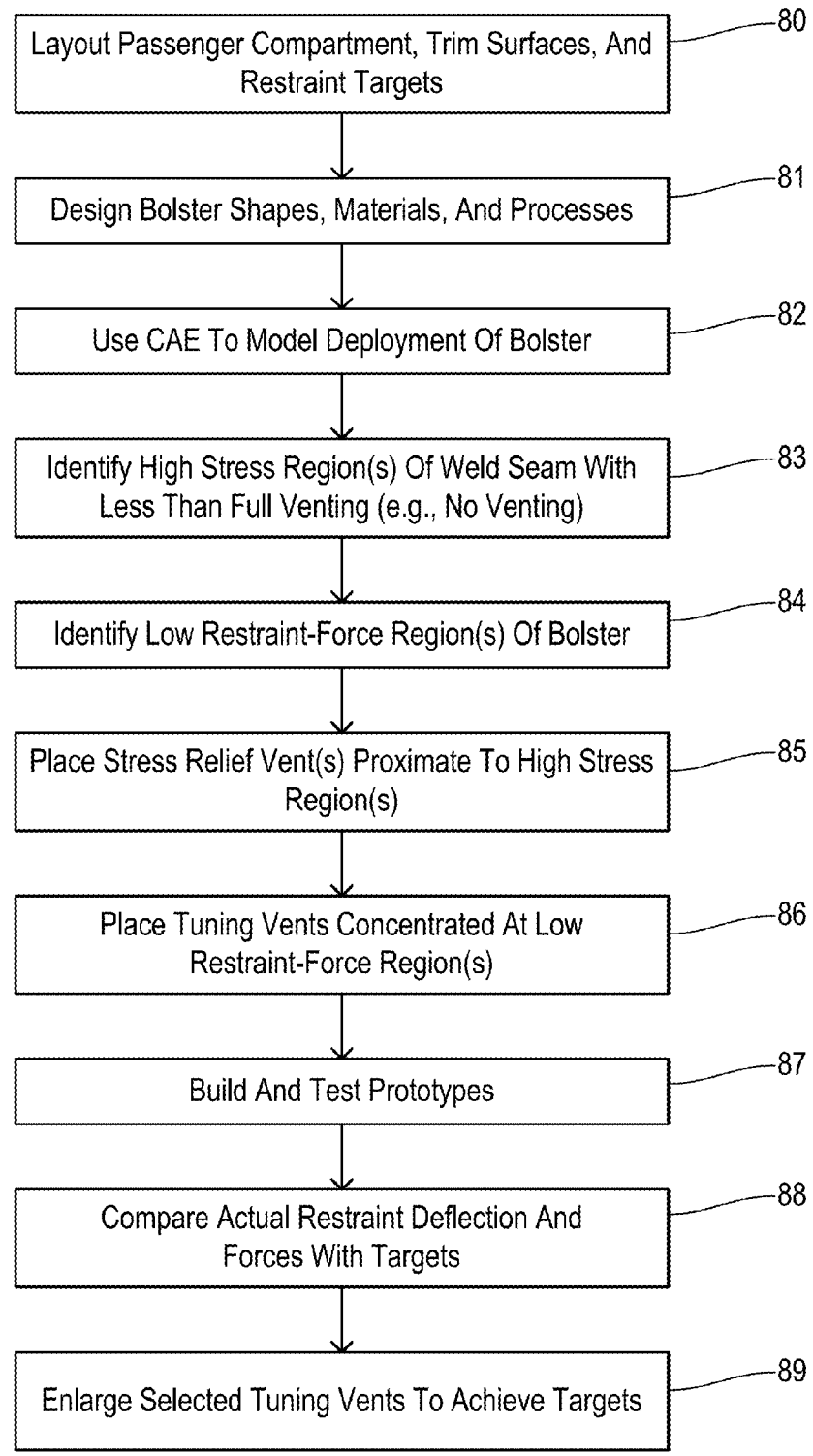
FIG. 11 is a flowchart showing one preferred embodiment of the invention.

A method for configuring vent openings in an active bolster is shown in greater detail in FIG. 11. During initial vehicle development in step 80, a vehicle design team lays out a passenger compartment, interior trim surfaces, passenger seating, and restraint target specifications as known in the art. In step 81, an active bolster is designed in accordance with the vehicle specifications, including the determination of the shapes for the bladder member and front trim wall, the materials to be used, inflator design, and the basic manufacturing processes to produce the active bolster. For example, the size and number of pleats in the pleated baffle corresponds to a desired expansion shape of the bladder member based on the expansion distance and an angled sweep of an instrument panel or glove box door with respect to a passenger seat (which places one side of the active bolster closer to the knees of the passenger than the other side).

In step 82, a CAE model of the active bolster is developed in order to model deployment of the bolster, the weld stress, and the restraint forces. In step 83, high stress regions are identified along the hot weld seam (wherein modeling is based on less than full venting). Using less than full venting helps to identify the regions of high stress. At least initially, the CAE modeling may assume no venting at all. Alternatively, high stress regions can be identified without CAE modeling, such as by associating the longest straight sides with a high stress region.

In step 84, low restraint-force regions are identified along the bolster in response to a desired restraint profile specified by a safety/restraint design group responsible for modeling impact forces during various vehicle crashes (e.g., using corresponding CAE or other tools known in the art).

Based on the locations of high stress regions and low restraint-force regions, the method proceeds in step 85 to place stress relief vents proximate to the high stress regions. In step 86, tuning vents are placed so they are concentrated at the low restraint-force region(s). Preferably, the stress relief vent(s) have a first aperture area which has an initial value greater than the smallest manufacturable size obtained with the injection molding process and tools being used. Each of the tuning vents has an initial aperture area less than the first aperture area and preferably equal to a smallest manufacturable size. In addition, a vent spacing is maintained such that an arcuate distance between adjacent vent openings is less than 90° (which means that the total number of vent openings is greater than or equal to five).

In step 87, a prototype active bolster is built and tested (with the initial and/or intermediate, modified aperture areas for the vent openings). During crash testing, profiles for the actual restraint forces/deflection are collected. In step 88, the actual restraint profiles are compared with the desired restraint profile (i.e., target). Based on differences between the actual and desired restraint profiles, selected tuning vents are enlarged in step 89 so that the target restraint characteristics are obtained.

What is claimed is:

1. A method of configuring inflation of an active bolster for mounting at an interior trim surface of a passenger compartment in an automotive vehicle, wherein the bolster comprises a plastic-molded front trim wall for deploying in a deployment direction toward a passenger in the passenger compartment, a plastic-molded bladder member joined along an outer perimeter with the trim wall by a hot weld seam to form an inflatable bladder wherein the bladder member includes at least one substantially circumferential pleated baffle, and an inflator for coupling an inflation gas into the inflatable bladder in response to a crash event of the vehicle, the method comprising the steps of:

configuring the shapes of the trim wall and bladder member to meet specifications for the automotive vehicle;

identifying at least one first region of highest stress on the hot weld seam associated with inflation of the bladder without full venting;

identifying at least one second region of lowest desired restraint force based on interaction between a deployment trajectory of the front trim wall and a desired restraint profile for a corresponding passenger;

placing a stress relief vent on the bladder member juxtaposed with the first region and having a first aperture area; and distributing a plurality of tuning vents along the hot weld seam wherein the tuning vents are concentrated at the second region, wherein the tuning vents each has a respective initial aperture area less than the first aperture area.

2. The method of claim 1 wherein the relief vent and tuning vents are distributed along the outer perimeter of the bladder member so that every arc of 90° of the outer perimeter includes at least one vent opening.

3. The method of claim 1 further comprising the steps of:

testing an actual restraint profile using the respective initial aperture areas;

comparing the actual restraint profile with the desired restraint profile to determine a mismatch; and increasing selected ones of the respective initial aperture areas to reduce the mismatch.

\* \* \* \* \*